US008422590B2

(12) United States Patent
Leibowitz et al.

(10) Patent No.: US 8,422,590 B2
(45) Date of Patent: Apr. 16, 2013

(54) APPARATUS AND METHODS FOR DIFFERENTIAL SIGNAL RECEIVING

(75) Inventors: Brian S. Leibowitz, San Francisco, CA (US); Jaeha Kim, Los Altos, CA (US); Hae-Chang Lee, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 362 days.

(21) Appl. No.: 12/746,018

(22) PCT Filed: Oct. 29, 2008

(86) PCT No.: PCT/US2008/012322
§ 371 (c)(1),
(2), (4) Date: Jun. 3, 2010

(87) PCT Pub. No.: WO2009/075713
PCT Pub. Date: Jun. 18, 2009

(65) Prior Publication Data
US 2010/0272216 A1    Oct. 28, 2010

Related U.S. Application Data

(60) Provisional application No. 61/005,581, filed on Dec. 6, 2007.

(51) Int. Cl.
*H04L 27/00* (2006.01)
(52) U.S. Cl.
USPC ........... 375/316; 375/219; 375/220; 375/288; 375/293
(58) Field of Classification Search .................. 375/316, 375/219, 220, 288, 293
See application file for complete search history.

(56) References Cited

U.S. PATENT DOCUMENTS

| 5,012,142 | A | | 4/1991 | Sonntag .................. 307/602 |
|---|---|---|---|---|
| 5,692,022 | A | * | 11/1997 | Haulin et al. ............. 375/357 |
| 5,852,630 | A | * | 12/1998 | Langberg et al. ........... 375/219 |
| 7,215,156 | B1 | * | 5/2007 | Li ........................ 326/115 |
| 7,823,003 | B1 | * | 10/2010 | Cheng .................... 713/600 |
| 2002/0174373 | A1 | | 11/2002 | Chang ..................... 713/401 |
| 2005/0033902 | A1 | * | 2/2005 | Tamura ..................... 711/2 |
| 2005/0084020 | A1 | | 4/2005 | Kikuchi ................... 375/257 |
| 2006/0181320 | A1 | | 8/2006 | Dreps et al. ............... 327/175 |
| 2006/0182215 | A1 | | 8/2006 | Dreps et al. ............... 375/372 |
| 2006/0190642 | A1 | * | 8/2006 | Aldereguia et al. ........... 710/60 |
| 2007/0136621 | A1 | * | 6/2007 | Alon et al. ................ 713/503 |
| 2007/0297551 | A1 | | 12/2007 | Choi ...................... 375/371 |
| 2008/0159371 | A1 | * | 7/2008 | Mellitz .................... 375/232 |

FOREIGN PATENT DOCUMENTS

WO    WO 01/78337    10/2001

* cited by examiner

*Primary Examiner* — Siu Lee
(74) *Attorney, Agent, or Firm* — Mahamedi Paradice Kreisman LLP; Lance M. Kreisman (57) ABSTRACT

A differential signal receiver 106 implements intra-pair skew compensation for improving data transfer on a differential channel. In an embodiment, the receiver implements sampling by—multiple clocks with different phases such that the signals of the differential channel may be separately or individually time adjusted to account for skew between them so that they may be differentially compared for data resolution. In one embodiment, a positive sampler and negative sampler are controlled by distinct clock signals to permit, at different times, sampling and holding of the positive and negative signals representing a data bit on the differential channel. A differential decision circuit may then differentially resolve the data using a latter one of the distinct clock signals. Timing generation circuitry for producing the offset clocks may include a skew detector that permits dynamic adjustment of the different clock signals according to skew associated with the signals of the differential channel.

28 Claims, 9 Drawing Sheets

APPARATUS AND METHODS FOR DIFFERENTIAL SIGNAL RECEIVING

CROSS-REFERENCE TO RELATED APPLICATIONS

Pursuant to 35 U.S.C. §365, this application claims priority from International Application No. PCT/US2008/012322, published as WO 2009/075713 A1 on Jun. 18, 2009 and published as WO 2009/075713 A4 on Sep. 24, 2009, which claims priority from U.S. Provisional Application No. 61/005,581, filed Dec. 6, 2007 and entitled "Apparatus and Methods for Differential Signal Receiving". International Application No. PCT/US2008/012322 and U.S. Provisional Application No. 61/005,581 are hereby incorporated by reference in their entirety.

BACKGROUND

Many high-speed, chip-to-chip electrical input/output interconnects are implemented as differential data links. In such a system, a data bit may be transmitted as signals on a positive signal path and a negative signal path. The data bit can be resolved at a receiver by subtracting the two signals and sampling the result. In such systems, the propagation of the signals along both paths must be maintained in synchrony to permit accurate data resolution with the signals. This typically requires careful matching of positive and negative path lengths. However, as data rates reach beyond multiple Gb/s (gigabits per second), intra-pair skew, e.g., time of flight differences between signals on one or more pairs of wires that constitute the differential link, may limit the achievable bit-error rate. Intra-pair skew may also be associated with mismatches in passive components and/or active devices, as well as wire parasitics. Intra-pair skew may result in received signals that are not fully differential because they may be somewhat affected by noise that would otherwise be cancelled during differential data resolution in the non-skewed case. Intra-pair skew may also reduce a receiver's timing margin.

Thus, there is a need for improved devices, systems and methods to address intra-pair skew.

BRIEF DESCRIPTION OF DRAWINGS

The present technology is illustrated by way of example, and not by way of limitation, in the figures of the accompanying drawings, in which like reference numerals refer to similar elements including.

DETAILED DESCRIPTION

Figure 1:
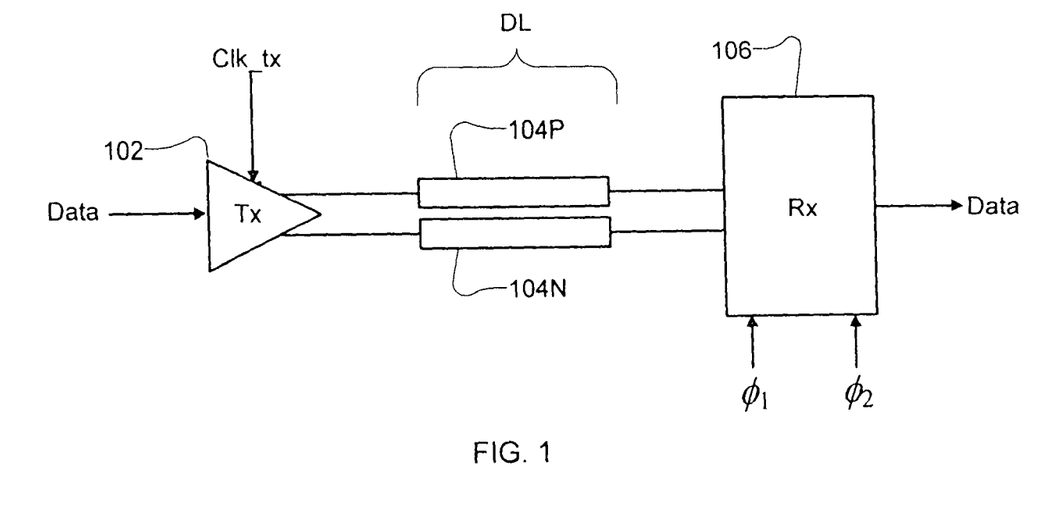
FIG. 1 shows example components in a system for compensating for intra-pair skew of the present technology.

In reference to FIG. 1, a system for compensating for intra-pair skew of the present technology may include a differential signal transmitter 102. The differential signal transmitter 102 will typically be timed by a transmit clock signal ("Clk_tx"). The transmit clock signal ("Clk_tx") controls timing of transmissions of differential data signals from the transmitter.

The differential signal transmitter 102 will typically be coupled with a differential signal link DL. As shown in the embodiment of FIG. 1, a differential signal link DL may include at least two wires such as a positive signal path 104P and a negative signal path 104N. In such an example of the system, a "1" data bit from the transmitter may be represented by transmitting (synchronously or otherwise) a high signal along the positive signal path 104P and a low signal along the negative signal path 104N. In such an example of the system, a "0" data bit from the transmitter may be represented by transmitting (synchronously or otherwise) a low signal along the positive signal path 104P and a high signal along the negative signal path 104N. Other schemes may also be employed to represent data along the link.

The respective signals of the data bit from the differential signal link DL may then be received by a differential signal receiver 106. The circuits of the differential signal receiver 106 resolve the signals of the differential signal link DL into the data that was transmitted from the differential signal transmitter 102. As shown in FIG. 1, in order to compensate for the skew between the signals of the differential link, (e.g., the positive signal of the positive signal path 104P and the negative signal path 104N), the differential signal receiver 106 may implement at least two clock signals such as first clock signal $\phi_1$ and second clock signal $\phi_2$ such that the receiver may be sensitive or receptive to the signals of the differential link at different times according to the timing of the first clock signal $\phi_1$ and second clock signal $\phi_2$. For example, the differential signal receiver 106 may perform sampling and differential comparison of the respective signals under control of the clock signals. Thus, the sampling and/or comparison circuit elements of the differential signal receiver 106 may be controlled by a timing scheme based on the first clock signal $\phi_1$ and second clock signal $\phi_2$.

Typically, the first clock signal $\phi_1$ and second clock signal $\phi_2$ will have a common timing (i.e., frequency) but may be out-of-phase with respect to one another. For example, the phase difference or phase offset between the first clock signal $\phi_1$ and second clock signal $\phi_2$ may be derived as a function of the skew between the signals of the differential signal link DL. As discussed in more detail herein, this timing difference may be pre-determined from an expected skew of the differential link or it may be automatically detected and measured such that the phase difference may be automatically optimized during system performance.

Figure 2:
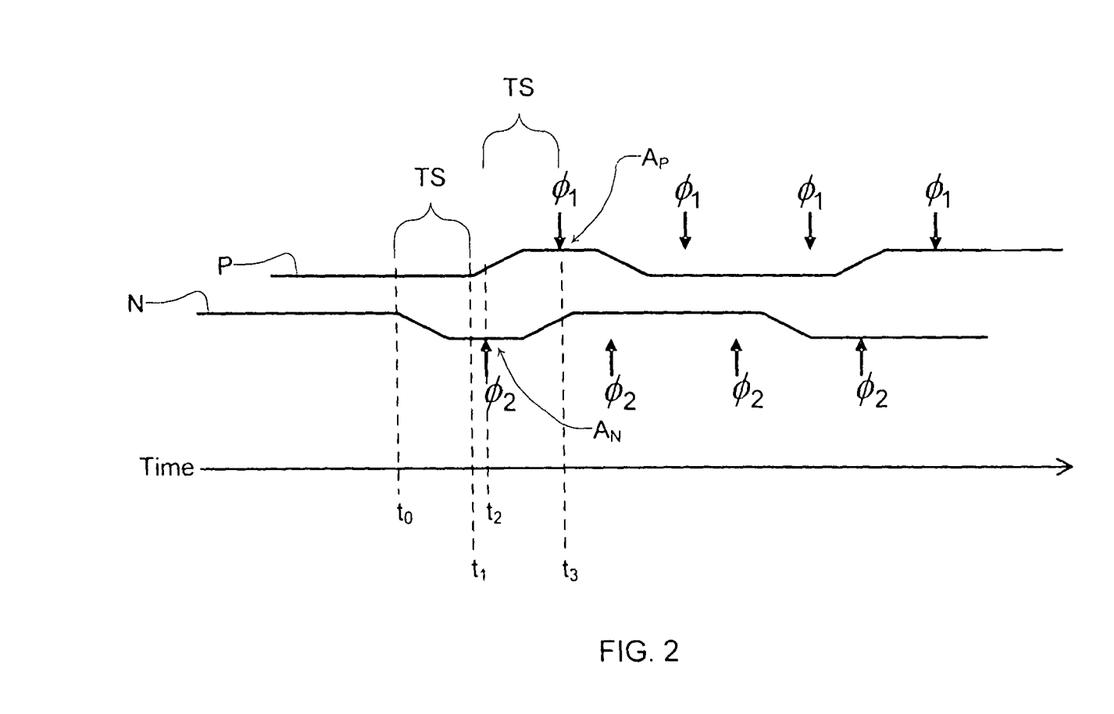
FIG. 2 illustrates differential signals and their respective sampling clock signals of the system for compensating for intra-pair skew in an embodiment of the present technology.

FIG. 2 illustrates a timing skew problem that may be compensated for by the differential signal receiver 106 of the present technology by implementing the first clock signal $\phi_1$ and second clock signal $\phi_2$. As shown in this example, the positive signal P has some timing skew TS with respect to the negative signal N such that the positive signal P is delayed from a position of synchrony with the negative signal N. In this differential signal example, a data value is represented by the signal levels at points $A_P$ and $A_N$. If the differential signal lines were well matched, the positive and negative signal levels would be synchronous such that the skew TS would be near or at zero delay time and points AP and AN would have a common time on the illustrated time axis of FIG. 2. However, due to the time of flight delay, the point $A_P$ of positive signal P will be received by a differential receiver at a later time than the point $A_N$ of the negative signal. Thus, in a typical differential receiver the actual signal levels associated with points $A_P$ and $A_N$ may not be used to differentially resolve the data of the two signals at those points. Rather, the signal levels of the positive and negative signals at time $t_2$ might be used for differentially resolving the data represented by points $A_P$ and $A_N$. This can result in data resolution errors. The differential receiver 106 implements the different clocks (e.g., $\phi_1$ and $\phi_2$) so that the resolution of the data represented by the positive signal P and the negative signal N may be made by actively time adjusting at least one of the signals to compensate for skew between them. Thus, the value of the positive signal at time $t_3$ and the value of the negative signal at time $t_2$ may be utilized at some common time for purposes of resolving the data represented by the signals, even if those signal levels still arrive at the differential receiver at different times.

Figure 3:
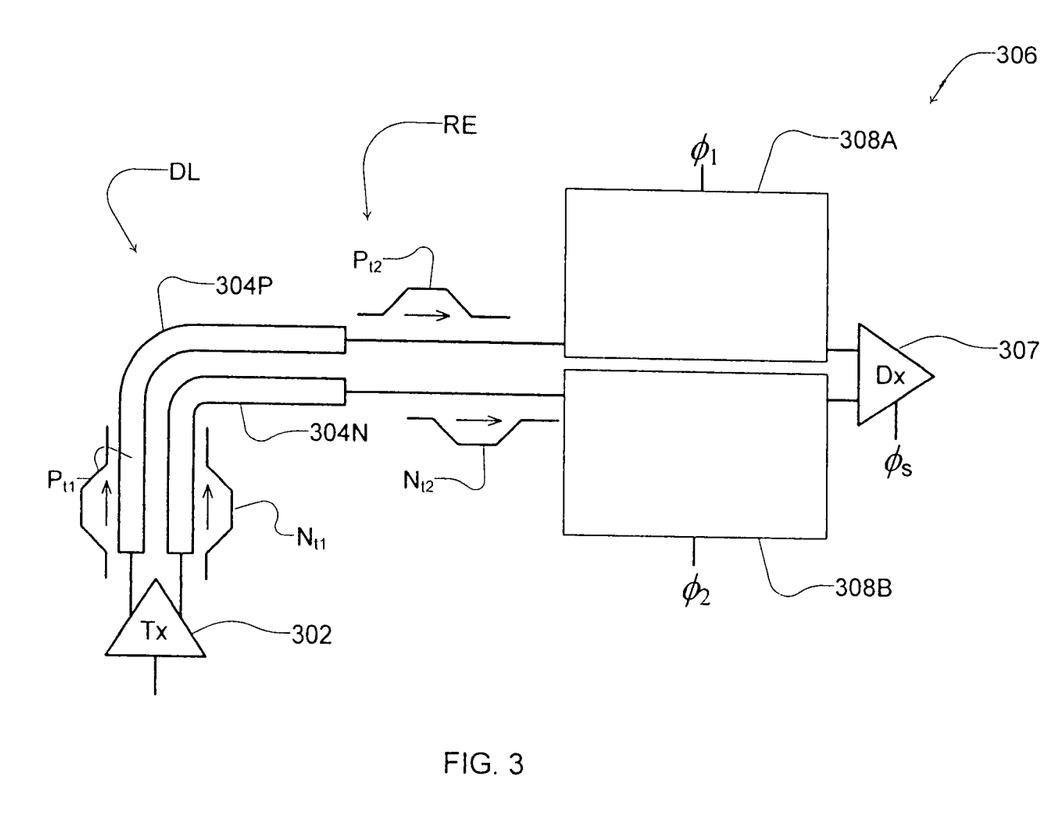
FIG. 3 shows sampler components in an embodiment of a differential signal receiver of the present intra-pair skew compensation technology.

FIG. 3 shows example components of a differential signal receiver 306 that may be implemented to compensate for such intra-pair skew with the previously mentioned clock signals. In this embodiment, the differential signal receiver 306 includes a differential decision circuit 307 and samplers 308A and 308B. The samplers 308A and 308B are coupled with the receiver end RE of the differential link DL. Typically, the samplers 308A and 308B may be formed with switches and capacitors respectively configured to track and hold the signals of the differential signal link DL. In this embodiment, the sampling of the positive and negative signals by samplers 308A and 308B are controlled by the first clock signal $\phi_1$ and the second clock signal $\phi_2$ respectively. For example, a switch or the gate of a transistor in each sampler may be coupled with one of the different clock signals to control the holding of one of the signal levels of the differential signals in a capacitor of each sampler. Thus, when timed as illustrated in FIG. 2, the samplers can hold at least one of the positive and negative signals in its respective sampler (e.g., in a capacitor of the sampler) an amount of time sufficient to compensate for a delay with respect to the other of the positive and negative signals.

The differential decision circuit 307 may be formed by a differential sampler and/or differential slicer (not shown) to compare the signals from the samplers 308A, 308B and to determine a received data bit from the compared signals in a differential manner. The differential decision circuit 307 effectively determines a data bit as the difference between the signals by determining whether or not the sample from the positive signal P is greater than the sample from the negative signal N. Thus, the circuit outputs a high signal when the sample from the positive signal is high and the sample from the negative signal is low. Conversely, the circuit outputs a low signal when the sample from the positive signal is low and the sample from the negative signal is high. In this operation, the differential decision circuit 307 may be clocked by a third clock signal $\phi_s$. The third clock signal $\phi_s$ may optionally be synchronized with the complement of the latter of the first clock signal $\phi_1$ and the second clock signal $\phi_2$.

In operation, the differential signal transmitter 302 drives the data signal represented by positive signal $P_{t1}$ and negative signal $N_{t1}$ respectively onto the positive signal path 304P and the negative signal path 304N of the differential signal link DL in near or substantial synchrony. As a further result of time of flight delay from the illustrated path length mismatch of the differential signal link DL, the positive signal $P_{t2}$ and the negative signal $N_{t2}$ arrive at the receiver end RE of the differential signal link DL out of synchrony. In case that the positive signal $P_{t2}$ lags the negative signal $N_{t2}$ as illustrated in FIG. 3, sampler 308B will hold the value of the negative signal $N_{t2}$ a sufficient time to compensate for the delay. Thus, when these components are combined with a typical differential decision circuit 307, the difference of the signals may be effectively determined by comparison of the positive signal and negative signal at a common time to resolve the received data. While the FIG. 3 illustrates a lag of the positive signal $P_{t2}$, it is to be understood the circuits of the differential signal receiver 306 may also address a lag by the negative signal N with respect to the positive signal P such as if the length of the positive signal path 304P is shorter than the length of the negative signal path 304N.

Figure 4:
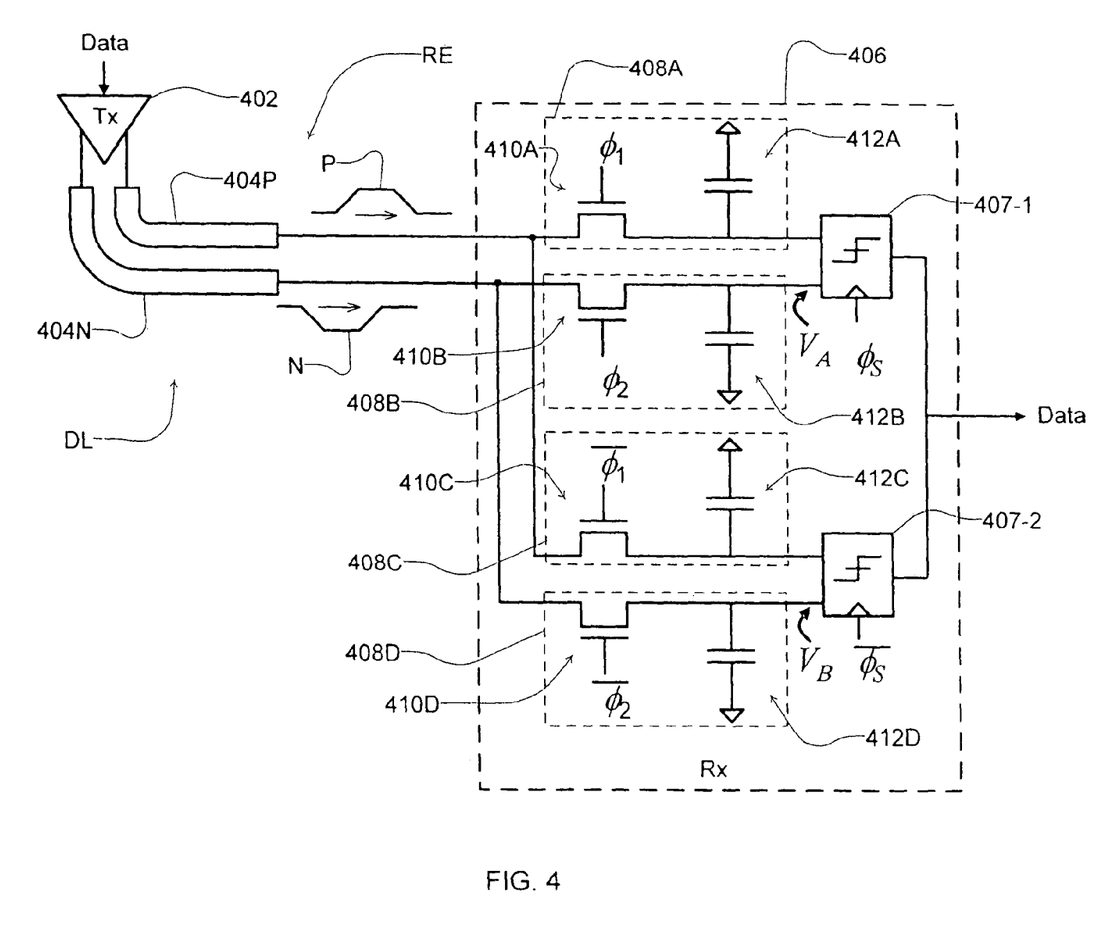
FIG. 4 illustrates example receiver components for intra-pair skew compensation in a double data rate system.

Another embodiment of a differential signal receiver 406 is shown in FIG. 4. In this embodiment, the device implements intra-pair skew compensation in a double data rate synchronous system. In such a system, data operations are coordinated to a provided system clock signal by transferring data on both the rising and falling edge of the system clock. The differential signal transmitter 402 and the differential signal link DL, including the positive signal path 404P and the negative signal path 404N, are comparable to those components of the embodiment of FIG. 3. However, in this embodiment, the differential signal receiver 406 includes two sets of the receiver components of the embodiment of FIG. 3, which are alternately clocked with the first, second and third clock signals of FIG. 3 as well as their compliments.

Thus, the differential signal receiver 406 includes samplers 408A and 408C coupled to track and hold the positive signal path 404P and samplers 408B and 408D coupled to track and hold the negative signal path 404N. Each sampler 408A, 408B, 408C, 408D is respectively configured with a switch 410A, 410B, 410C, 410D and capacitor 412A, 412B, 412C, 412D for this purpose. The four switches may, for example, be implemented as NMOS passgates, which are closed when their respective clock signals are high, and open when their respective clock signals are low. The first differential decision circuit 407-1 resolves received data with sampled values from samplers 408A and 408B that have sampled the differential signal link DL based on the timing of the first clock signal $\phi_1$ and the second clock signal $\phi_2$ respectively. The second differential decision circuit 407-2 resolves received data with sampled values from samplers 408C and 408D that have sampled the differential signal link DL based on the timing of the complement of the first clock signal $\phi_1$ and the complement of the second clock signal $\phi_2$ respectively (i.e., $\phi_1$-bar and $\phi_2$-bar). In the embodiment, the first differential decision circuit 407-1 is clocked by the third clock signal $\phi_s$, which may be the complement of the latter of the first clock signal $\phi_1$ and the second clock signal $\phi_2$. Moreover, the second differential decision circuit 407-2 is clocked by the complement of the third clock signal $\phi_s$ (i.e., $\phi_s$-bar).

Figure 5:
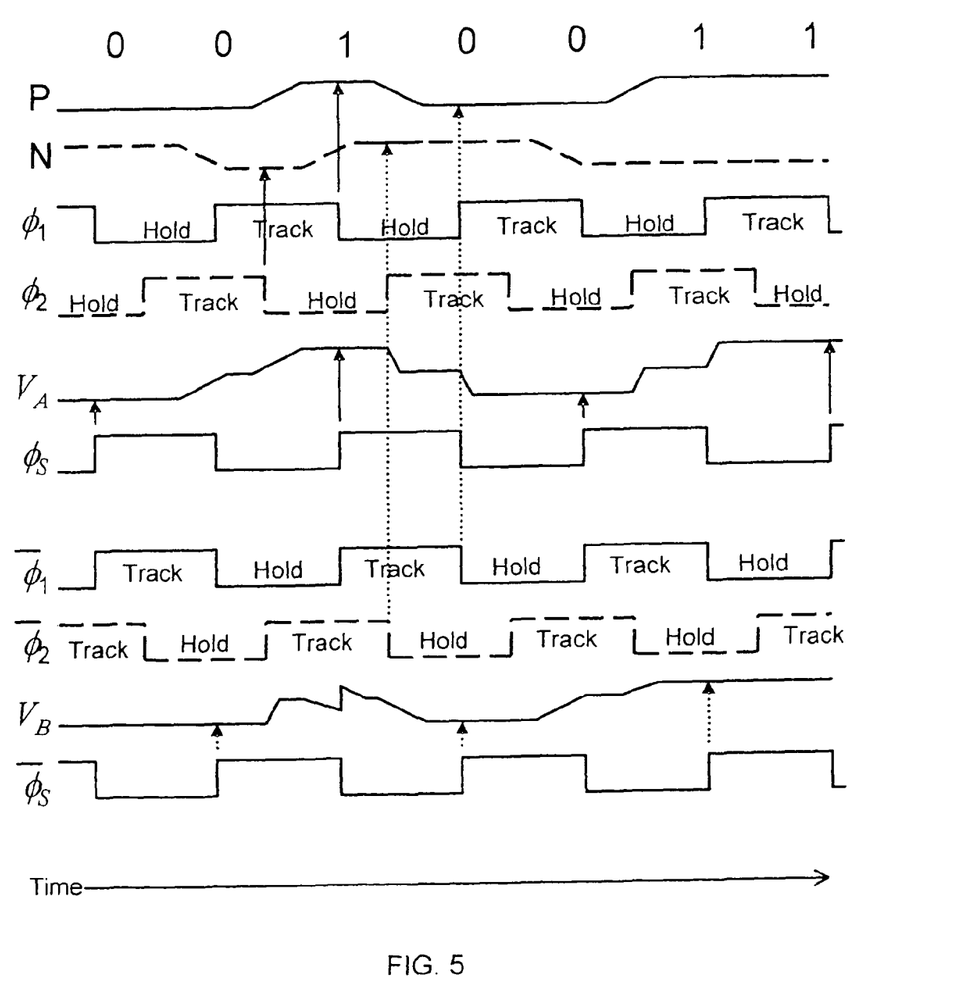
FIG. 5 is a signal diagram showing intra-pair skew in the signals of a differential link along with clocking signals of the present intra-pair skew compensation technology.

The signals associated with the operation of the embodiment of FIG. 4 are illustrated in the signal diagram of FIG. 5. The positive signal P and the negative signal N jointly represent a sequentially transmitted data signal of "0010011". However, intra-pair skew is illustrated by the positive signal P being delayed with respect to the negative N. The first clock signal $\phi_1$ and its compliment (i.e., $\phi_1$-bar) alternately control timing of the holding of sequential samples of the positive signal P whereas the second clock signal $\phi_2$ and its compliment (i.e., $\phi_2$-bar) alternately control timing of the holding of sequential samples of the negative signal N. Signal $V_A$ constitutes the differential mode of the positive signal P and the negative signal N formed by the subtraction of samples from those signals using first clock signal $\phi_1$ and the second clock signal $\phi_2$ but due to the lower frequency of these clocks with respect to the unit interval of the positive signal and negative signal, $V_A$ is based on subtraction of the samples from every other data interval (e.g., "0-1-0-1"). Consequently, when the rising edge of the third clock $\phi_s$ is used for resolving the data from $V_A$ every other bit can be determined from $V_A$.

Similarly, signal $V_B$ constitutes the differential mode of the positive signal P and the negative signal N formed by the subtraction of samples from those signals using the complement of the first clock signal $\phi_1$ (i.e., $\phi_1$-bar) and the complement of the second clock signal $\phi_2$ (i.e., $\phi_2$-bar) but due to the lower frequency of these clocks with respect to the unit interval of the positive signal and negative signal, $V_B$ is based on subtraction of the samples from every other data interval (e.g., "-0-0-1-"). Consequently, when the rising edge of the complement of third clock signal $\phi_s$ (i.e., $\phi_s$-bar) is used for resolving data from $V_B$, every other data bit not determined from $V_A$ can be determined from $V_B$. In this way, intra-pair compensation may be implemented with a double data rate data system.

Figure 6:
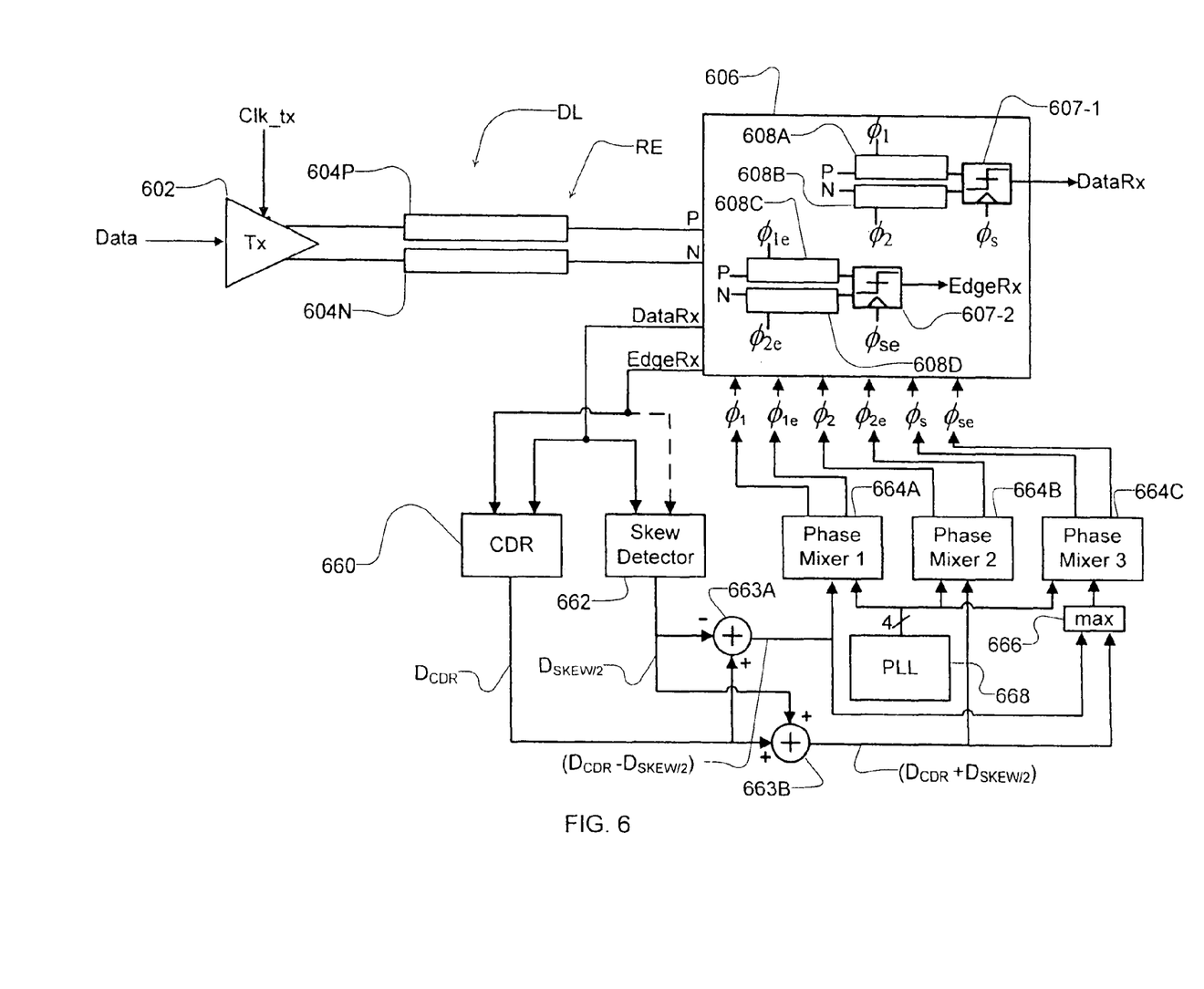
FIG. 6 is a block diagram of a receiver and timing generation components in an embodiment of the present intra-pair skew compensation technology.

While the clock signals may be predetermined and preset based on expected intra-pair skew at design time, embodiments of the intra-pair skew technology may also include timing generation circuits to optimize setting of the various clock signals in a dynamic manner during system performance or in a calibration mode with transmitted test data. A suitable example embodiment for this purpose is illustrated in FIG. 6. In the embodiment of FIG. 6, the differential signal transmitter 602, positive signal path 604P, negative signal path 604N and differential signal receiver 606 may be constructed and operate as discussed with respect to FIGS. 1, 2 and 3 for resolution of the received data shown in FIG. 6 as "DataRx". Thus, the differential signal receiver may include samplers 608A and 608B which are respectively clocked by the first clock signal $\phi_1$ and the second clock signal $\phi_2$. Data may be resolved from these samplers with differential decision circuit 607-1 in a manner previously described.

However, the system may also optionally implement samplers 608C, 608D for edge sampling of the differential link DL. The sampler 608C is implemented with a first edge clock signal $\phi_{1e}$ such that it will time sampling and holding of the incoming positive signal P at the edges of data eye of that signal. Similarly, sampler 608D is implemented with a second edge clock signal $\phi_{2e}$ such that it will time sampling and holding of the incoming negative signal N at the edges of data eye of that signal. Additional differential decision circuit 607-2 outputs an edge signal ("EdgeRX") by comparing the output of samplers 608C, 608D in a differential manner such as the manner previously described with respect to differential decision circuit 607-1. The differential decision circuit 607-2 is further timed by a third edge clock signal $\phi_{se}$ that is set to time operation of the differential decision circuit 607-2. This signal may be set to be in synchronism with the complement of the latter one of the first edge clock signal $\phi_{1e}$ and the second edge clock signal $\phi_{2e}$.

In addition to these elements, the embodiment may also implement a clock and data recovery circuit 660, a skew detector 662, adders 663A, 663B, phase mixers 664A, 664B, 664C, max selector circuit 666 and phase lock loop 668.

These additional components assist in the generation of the first clock signal $\phi_1$, the second clock signal $\phi_2$ and the third clock signal $\phi_s$ and their respective complements (i.e., $\phi_{1e}$, $\phi_{2e}$ and $\phi_{se}$) as shown in FIG. 6.

Output of received data DataRx and the edge signal EdgeRx is supplied to the clock and data recovery circuit 660. The clock data recovery circuit 660 may be a conventional circuit that outputs a signal for detecting a timing associated with the center of the data eye of the differential signal from the received data DataRx and the edge signal EdgeRx. Its output, shown in FIG. 6 as $D_{CDR}$, represents a digital value associated with the determined timing. The output in turn may be utilized in the adjustment of a phase mixer for adjusting a phase of a generated clock signal.

Output of received data DataRx is also supplied to the skew detector 662. The skew detector 662 quantifies the skew or phase difference between the positive signal P and the negative signal N. Optionally, the skew detector 662 may also be supplied with the edge signal EdgeRx depending on the method utilized by the skew detector. The skew detector 662 may include logic circuits that implement one of the methods illustrated in FIG. 7 as discussed in more detail herein. The output of the skew detector 662, shown in FIG. 6 as $D_{SKEW/2}$, represents a digital value associated with half of the determined skew time. The output in turn may be utilized in the adjustment of a phase mixer for adjusting a phase of a generated clock signal (in this case, the phase difference between clock signals $\phi_1$ and $\phi_2$). Depending on the implemented method and the condition of the signals of the system, the value of $D_{SKEW}$ may be positive or negative.

The output of the clock and data recovery circuit 660 and the output of the skew detector 662 are combined in adders 663A, 663B. Adder 663A negates the output of the skew detector and adds it to the output of the clock and data recovery circuit 662. The output of adder 663A represents a phase setting ($D_{CDR}-D_{SKEW/2}$) for a first phase mixer 664A. The phase setting permits phase mixer 664A to generate first clock signal $\phi_1$ with a phase such as the one illustrated in FIG. 2. The phase mixer 664A may also generate the complement of the first clock signal (e.g., $\phi_{1e}$). Under the selection control provided by the phase setting ($D_{CDR}-D_{SKEW/2}$), the phase mixer 664A combines reference clock signals provided from PLL 668 in a manner to produce a clock signal at the desired phase of the first clock signal $\phi_1$ and its complement. While FIG. 6 shows the phase lock loop 668 producing four reference clocks, which may be a set of quadrature reference clocks based from a system clock that is not shown, fewer or more such reference clocks may be produced for the phase mixers 664A, 664B, 664C by the phase lock loop 668.

Similarly, adder 663B adds both outputs from the clock and data recovery circuit 660 and the output of the skew detector 662. The output of adder 663B represents a phase setting ($D_{CDR}+D_{SKEW/2}$) for a second phase mixer 664B. This phase setting permits phase mixer 664B to generate second clock signal $\phi_2$ with a phase such as the one illustrated in FIG. 2. The phase mixer 664B may also generate the complement of the first clock signal (e.g., $\phi_{2e}$). Under the selection control provided by the phase setting ($D_{CDR}+D_{SKEW/2}$), the phase mixer 664B combines the timing signals provided from PLL 668 in a manner to produce a clock signal at the desired phase of the second clock signal $\phi_2$ and its complement.

Finally, both phase settings (e.g., ($D_{CDR}+D_{SKEW/2}$) and ($D_{CDR}-D_{SKEW/2}$)) are supplied to a max selector 666. The max selector 666 selects the greater value of the two phase settings and outputs that greater value to the third phase mixer 664C. Thus, depending on the greater value, the third phase mixer 664C will generate a clock signal in the same manner and in substantial synchrony with the clock signals generated by either phase mixer 664A or phase mixer 664B. The output of the phase mixer 664C is a clock signal at the desired phase of the third clock signal $\phi_s$ and its complement ($\phi_{se}$).

While the embodiment of the system illustrated in FIG. 6 implements a differential signal receiver like the one illustrated in FIGS. 1 and 3, the circuit may be easily modified to be suitable for use with the double data rate version illustrated in FIG. 4. In such an embodiment, the phase mixers 664A, 664B and 664C would produce clock signals with frequencies equal to half the data rate, with the positive and complementary versions being used for alternate data sampling paths. Consequently, additional phase mixers may be added to produce edge sampling clocks in quadrature with $\phi_1$ and $\phi_2$ respectively. Similarly, further samplers and a differential decision circuit would be added to the differential signal receiver such that it would be comparable to the receiver device illustrated in FIG. 4.

Figure 7:
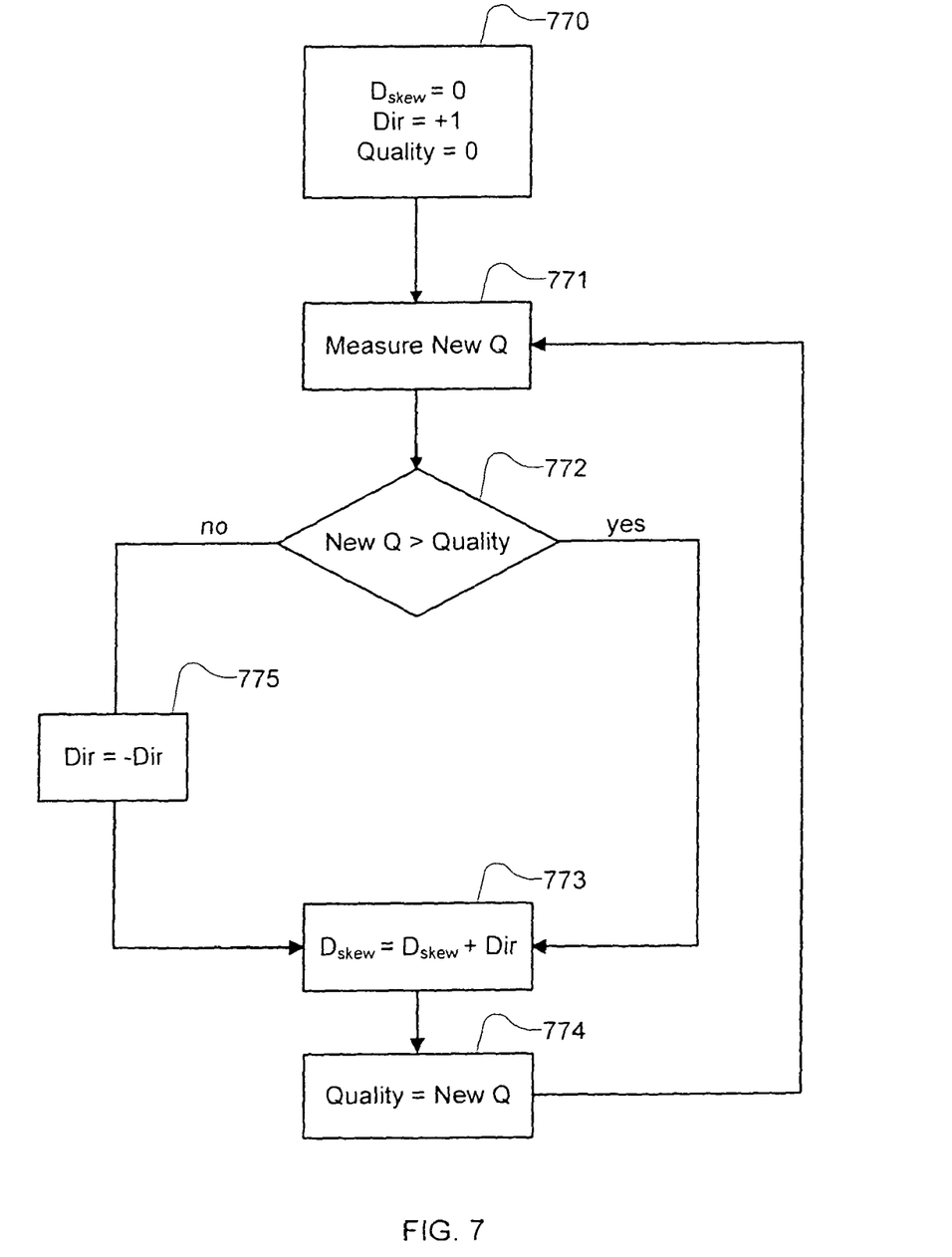
FIG. 7 depicts a flow chart of a method for intra-pair skew detection and/or quantification in an embodiment of the present intra-pair skew compensation technology.

As previously mentioned, FIG. 7 is a flow diagram of an example method that may be implemented by logic circuits of the skew detector 662 shown in FIG. 6. In one embodiment, a gradient descent method may be employed to quantify the skew or phase difference between the positive signal P and the negative signal N. In step 770, the method is initialized to set a skew variable ("$D_{skew}$") to 0. Similarly, a directional variable ("Dir") is set to +1 and a quality variable ("Quality") is initially set to 0.

In step 771, a new measure ("New Q") of the quality of performance of the system based on the presently set skew variable $D_{skew}$ is determined. For example, data received (e.g., DataRx) by the differential signal receiver 606 shown in FIG. 6 may be used by a bit error rate circuit (not shown separately from the skew detector 662 of FIG. 6) to determine a bit error rate (BER). In this case, a value determined by the bit error rate circuit or a function thereof such as 1/BER may be used as the new measure ("New Q") of quality. Alternatively, the skew detector 662 may be implemented to assess the quality of the width of the horizontal eye opening or the height of the vertical eye opening of the differential mode of the positive signal P and the negative signal N. For example, one way of measuring this quality by the width or horizontal opening of the data eye is to transmit a known data pattern (e.g., "101010 . . . ") and measure the timing margin that permits accurate receipt of the known data pattern. Alternatively, if the transmitter is implemented to transmit a smoothly-varying signal such as sinusoids, the quality can be measured by the amplitude of the received eye. The amplitude is the maximum when the two differential inputs have zero phase offset. In such cases, in addition to the information of the received data (e.g., DataRx) the detector may utilize information based on the edge signal (e.g., EdgeRx) to assess the width or height. In either case, the width or height measure may then be used as the new measure ("New Q") of quality.

The quality assessment methods described may optionally include skew detection logic to temporarily control parameters of the receiver such as $D_{CDR}$ while making the "quality" measurement. The signal paths involved in this type of control will be understood but are not explicitly shown in FIG. 6 for purposes of simplifying an explanation of the present technology. For example, under control logic of the skew detector, known test data patterns may be successively received by the differential receiver with incremental changes in the $D_{CDR}$ signal while maintaining an existing $D_{SKEW}$ value. The received data may then be compared against the known pattern of the data to determine if the data was received accurately. Such steps can be used to measure the effective horizontal eye opening of the received data signal as the measure of quality.

Process flow then advances to step 772. In step 772, the previous Quality variable is compared with the new measure ("New Q"). If the new measure is greater than the previously set Quality, then process flows to step 773. Otherwise, if it is not, then process flows to step 775. In step 775, the directional value is changed by negating the previously set direction value Dir. In step 773, the skew variable $D_{skew}$ is modified by the presently set directional value Dir. Process then moves to step 774.

At step 774, the Quality variable is set to the new quality value that was determined by the procedure for determining quality of present performance of the system from step 771. Process then returns to step 771.

In this way, the method repeatedly increases and decreases the skew variable $D_{skew}$ such that it will settle at or near a value that maintains the measure of quality at an optimal or desired level. The skew variable may then be halved to form the output of the skew detector 662.

In view of the phase difference between $\phi_1$ and $\phi_2$, the overall signal receiver may be considered as not operating in a truly differential manner. Particularly, because the P and N signals are sensed at different times responsive to $\phi_1$ and $\phi_2$, any dynamic noise signal that is common to both P and N may be converted to a differential sample. This makes the receiver sensitive to high frequency common mode noise sources such as supply noise and crosstalk. As the phase separation between $\phi_1$ and $\phi_2$ increases, the receiver becomes more sensitive to common mode noise sources at lower frequencies, potentially resulting in greater corruption of the desired signal. Consequently, in some embodiments the optimal phase difference between $\phi_1$ and $\phi_2$ may be less than the phase difference between the received P and N signals, in order to balance the benefit of skew correction against the errors introduced by common mode to differential mode conversion due to non-simultaneous sampling. Because the method of FIG. 7 is responsive to a desired signal quality measurement, and not directly to a measured phase difference between the P and N signals, it is able to balance these effects to determine the optimum sampling clock phase difference. However, in other embodiments, particularly where common mode noise is known to be a relatively minor factor, it may be sufficient to measure the phase difference between P and N signals and directly use the measured result to set the phase difference between $\phi_1$ and $\phi_2$.

Figure 8:
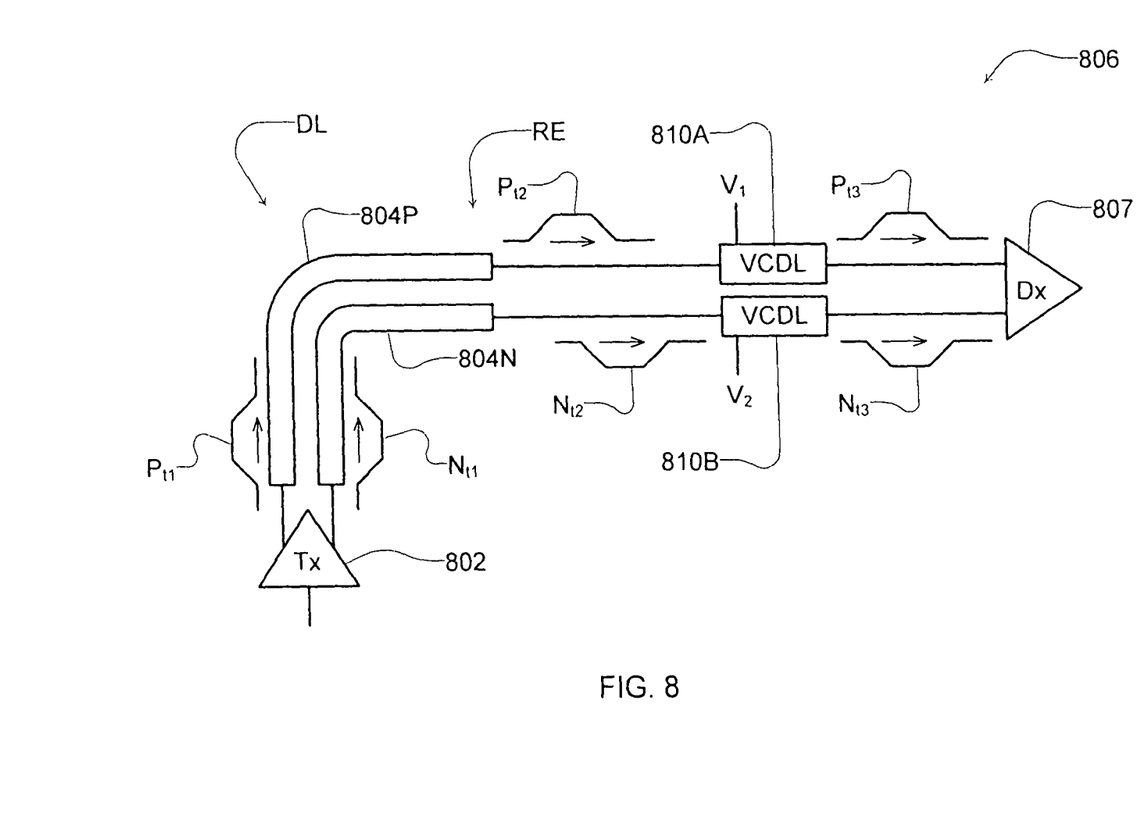
FIG. 8 is another intra-pair skew compensation embodiment of the present technology including voltage controlled delay lines.

In an alternative intra-pair skew compensation embodiment shown in FIG. 8, the differential signal receiver 806 may employ voltage controlled delay lines 810A, 810B. The voltage controlled delay lines (VCDL) each have a control input voltage signal $V_1$, $V_2$ that may be adjusted to increase or decrease a delay applied to their respective inputs. For example, as illustrated in FIG. 8, the differential signal transmitter 802 transmits data on the differential signal link DL. In the illustrated example, the length of the positive signal path 804P delays the positive signal P with respect to the negative signal N of the negative signal path 804N. However, by increasing the input voltage signal $V_2$ relative to the input voltage signal so that VCDL 8103 adds a longer delay than VCDL 810A, the negative signal $N_{t3}$ may arrive at the differential decision circuit 807 substantially synchronously with the positive signal $P_{t3}$ for making the differential decision to resolve the data.

Figure 9:
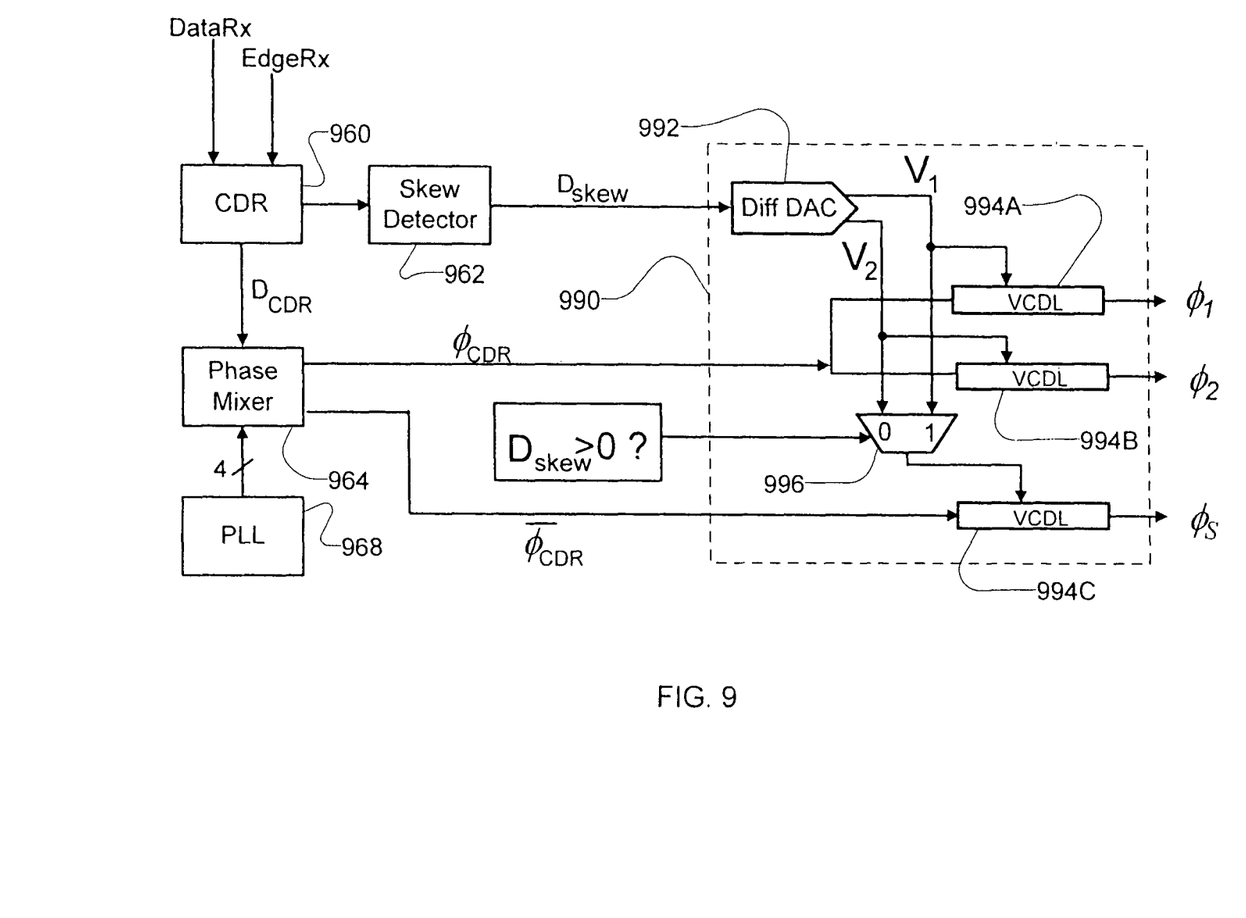
FIG. 9 is a block diagram of an alternative timing generator capable of generating multiple clock signals utilizing voltage controlled delay lines.

FIG. 9 illustrates a suitable timing generator 990 that may replace the phase mixers 664A-C and max selector 666 of FIG. 6. The timing generator 990 includes a differential digital to analog converter 992, an analog multiplexer 996 and voltage controlled delay lines 994A, 994B, 994C. Based on a skew value $D_{SKEW}$, which may be determined as previously described by skew detector 962 based on input from clock and data recovery circuit 960, the differential digital to analog converter 992 circuit converts the digital value of $D_{SKEW}$ into two voltage signals (e.g., $V_1$ and $V_2$) such that the difference of the value of the analog voltage signals corresponds to the skew value $D_{SKEW}$. The input signal to the voltage controlled delay lines 994A, 994B is a common CDR clock signal $\phi_{CDR}$ produced by a clock and data recovery circuit 960 and phase mixer 964 that is implemented to align its phase such that the final sampling clocks are aligned with the received data signal recovered from the differential link. The phase of clock signal $\phi_{CDR}$ may be generated by phase mixer 964 based on input from a phase lock loop 968 and a conventional clock and data recovery logic block 960. The input signal to the voltage controlled delay line 994C is the complement of the common CDR clock signal (i.e., $\phi_{CDR}$-bar) that may also be generated by clock and data recovery circuit 960 and phase mixer 964.

The voltage signals $V_1$ and $V_2$ are then applied to respectively control the delay of the voltage controlled delay lines 994A and 994B. Since the difference of voltage signals $V_1$ and $V_2$ is comparable to the amount of the detected skew of the positive and negative paths of the differential link, the respective outputs of the voltage controlled delay lines 994A and 994B will be the first clock signal $\phi_1$ and the second clock signal $\phi_2$. As a consequence, the first clock signal $\phi_1$ and the second clock signal $\phi_2$ are out of phase with respect to each other by an amount comparable to the skew between the positive and negative paths of the differential link.

Finally, the voltage signals $V_1$ and $V_2$ may be input to multiplexer 996 to select the greater of the two for setting a delay control of the voltage controlled delay line 994C to generate the third clock signal $\phi s$. The control line of the multiplexer 996 may be set by a logic circuit (not shown) that is set high if the skew value $D_{SKEW}$ is greater than zero ($D_{SKEW} > 0$) or that is set low if the skew value $D_{SKEW}$ is not greater than zero. When $D_{skew}$ is greater than 0, then $V_1$ is also greater than $V_2$. Thus, the mux will select $V_1$ in this case.

Optionally, the timing generator 990 may be implemented for also generating the complements of the $\phi_1$, $\phi_2$ and $\phi s$ clock signals such that the timing generator may be used in differential signal receiver of a double data rate system as previously discussed. In this case, three additional voltage controlled delay lines may be added with the same organization of the voltage signal controls as illustrated in FIG. 9. However, the complement of the CDR clock signal $\phi_{CDR}$ (i.e., $\phi_{CDR}$-bar) would be applied to the three additional voltage controlled delay lines. Thus, the three additional voltage controlled delay lines would produce $\phi_1$-bar, $\phi_2$-bar and $\phi s$-bar clock signals for implementation with a double data rate receiver as previously discussed.

As discussed herein, the differential signal link DL and the differential signal receiver components may form or be part of the signal connections between or in the integrated circuits of digital processing devices, computers, computer peripherals, graphics processing devices, memory chips and systems (e.g., RAM applications), game consoles, monitors, digital televisions, set-top boxes, mobile devices, etc. By way of example, the circuits may be implemented as part of a central processing unit or CPU as commonly employed in a digital computer or may be employed as an intermediary between the CPU and other circuit chips. The circuits as discussed herein can be incorporated in the communication path between a processor such as a CPU and a cache memory. Thus, received data signals may be baseband data signals that are transmitted between circuit components of a common apparatus without modulation on a carrier wave or demodulation thereof. The technology may also be implemented as elements of point-to-point connections according to protocols such as PCI Express, Serial ATA and other protocols. The technology can also be used with bus connections, i.e., arrangements in which the same signal is sent to plural devices connected to the same conductors. Embodiments as discussed herein may even form the communication path between one or more memories and a memory controller.

In general, each of the circuits implemented in the intra-pair skew compensation technology presented herein may be constructed with electrical elements such as traces, capacitors, resistors, transistors, etc. that are based on metal oxide semiconductor (MOS) technology, but may also be implemented using other technology such as bipolar technology or any other technology in which a signal-controlled current flow may be achieved.

Furthermore, these circuits may be constructed using automated systems that fabricate integrated circuits. For example, the components and systems described may be designed as one or more integrated circuits, or a portion(s) of an integrated circuit, based on design control instructions for doing so with circuit-forming apparatus that controls the fabrication of the blocks of the integrated circuits. The instructions may be in the form of data stored in, for example, a computer-readable medium such as a magnetic tape or an optical or magnetic disk. The design control instructions typically encode data structures or other information describing the circuitry that can be physically created as the blocks of the integrated circuits. Although any appropriate format may be used for such encoding, such data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can then use such encoded data to fabricate integrated circuits comprising one or more of the circuits described herein.

In the foregoing description and in the accompanying drawings, specific terminology and drawing symbols are set forth to provide a thorough understanding of the present technology. In some instances, the terminology and symbols may imply specific details that are not required to practice the technology. For example, although the terms "first", "second" and "third" have been used herein, unless otherwise specified, the language is not intended to provide any specified order or limit but merely to assist in explaining elements of the technology. Furthermore, although the technology herein has been described with reference to particular embodiments, it is to be understood that these embodiments are merely illustrative of the principles and applications of the technology. It is therefore to be understood that numerous modifications may be made to the illustrative embodiments and that other arrangements may be devised without departing from the spirit and scope of the technology.

For example, as previously illustrated, the technology may be formed by a receiver comprising circuitry where the circuitry produces a received data bit. The circuitry may further produce the data bit by sensing a first transmitted signal on a first signal path based on a clock signal of a first phase and by sensing a second transmitted signal on a second signal path based on a clock signal of a second phase. Moreover, the second phase may be offset from the first phase.

Nevertheless, other embodiments may also be implemented. For example, while some of the embodiments previously described, such as the embodiment of FIG. 3, have illustrated a single sampler at a receiver end RE of the each of the positive signal path 304P and the negative signal path 304N, additional samplers may be cascaded before the differential decision circuit 307 according to the principles described herein to permit compensation for greater skew between the paths of the differential link DL.

Moreover, although wired channels are explicitly discussed, wireless channels may also be implemented with the receiver technology so that differential signals may be made and received between chips using wireless transmitters and receivers that operate by, for example, infrared data signals or electromagnetic data signals sent between the circuit blocks of the technology. Similarly, the channels may be implemented with capacitive, inductive and/or optical principles and can use components for such channels, such as the transmitter and receiver technology capable of transmitting data by such channels.

The invention claimed is:

1. A differential receiver for receiving a differential signal including a first signal and a second signal comprising:
 a first sampler operable to receive the first signal and generate a first sample based on a first clock signal having a first phase;
 a second sampler operable to receive the second signal and generate a second sample based on a second clock signal having a second phase; and
 a comparator communicatively coupled to the first and second samplers and operable to generate a data bit based on the first and second samples,
 wherein a difference between the first and second phases is a function of an approximation of a timing skew between the first signal and the second signal.

2. The differential receiver of claim 1 wherein each of the first and second samplers comprises a transistor and a capacitor.

3. The differential receiver of claim 1 further comprising a timing generator operable to generate the first clock signal having the first phase and to generate the second clock signal having the second phase.

4. The differential receiver of claim 1 further comprising a phase optimization circuit, the phase optimization circuit being operable to determine a phase offset based on at least one performance parameter of the differential receiver and to set at least one of the first phase of the first clock signal and the second phase of the second clock signal based on the determined phase offset.

5. The differential receiver of claim 1 further comprising:
 a third sampler operable to receive the first signal and generate a third sample based on a third dock signal having a third phase;
 a fourth sampler operable to receive the second signal and generate a fourth sample based on a fourth clock signal having a fourth phase; and
 a comparator communicatively coupled to the third and fourth sampler and operable to generate a data bit based on the third and fourth samples,
 wherein the third clock signal of the third phase is a complement of the first clock signal having the first phase and wherein the fourth clock signal of the fourth phase is a complement of the second clock signal having the second phase.

6. A method of receiving a transmitted data bit in the form of a differential signal including a first transmitted signal and a second transmitted signal from a differential driver comprising:
 sampling the first transmitted signal received via a first signal path from the differential driver using a first timing signal to determine a first sample value;
 sampling the second transmitted signal received via a second signal path from the differential driver using a second timing signal to determine a second sample value; and
 resolving a received data bit value from the first sample value and the second sample value,
 wherein the first timing signal and the second timing signal have different phases, the difference between the phases being a function of an approximation of a timing skew between the received first transmitted signal and the received second transmitted signal.

7. The method of claim 6 wherein the resolving comprises comparing the first sample value and the second sample value and sampling a result of the comparison.

8. The method of claim 6 further comprising:
 deriving the first timing signal and the second timing signal such that a phase offset between the timing signals corresponds to at least a part of a phase delay between the first transmitted signal and the second transmitted signal.

9. The method of claim 8 wherein the deriving comprises mixing a plurality of clock signals to form the first clock signal and the second clock signal.

10. The method of claim 8 wherein the deriving comprises setting the phase offset by evaluating a quality of performance of processing of the received differential signal.

11. A differential receiver for recovering data from a differential signal path having a timing skew between the positive and negative lines of the differential signal path, the differential receiver comprising a means for sampling the positive and negative lines of the differential signal path controlled by a first clock signal having a first phase and a second clock signal having a second phase, respectively, the first and second phases being offset as a function of an approximation of the timing skew between the positive and negative lines of the differential signal path and a differential decision means for resolving data output from the means for sampling the positive and negative lines of the differential signal path.

12. The receiver of claim 11 further comprising means for detecting a phase offset by evaluating a quality of performance of the differential receiver and for generating the first and second clock signals in accordance with the detected offset.

13. The receiver of claim 11 wherein the means for sampling comprises a first sampler operable to sample the positive line and a second sampler operable to sample the negative line.

14. The receiver of claim 11 wherein the differential decision means comprises a differential sampler.

15. The receiver of claim 14 wherein the differential decision means is controlled by a clock signal having a phase approximately in synchrony with a complement of a latter one of the first and second clocks signals.

16. A non-transitory information-bearing medium having computer-readable information thereon, the computer-readable information to control a circuit-forming apparatus to form a block of an integrated circuit including a differential signal receiver for receiving a differential signal including first and second signals from first and second signal paths, respectively, the computer-readable information comprising:

instructions to form at least one receiver circuit to receive the first and second signals from the first and second signal paths, respectively;

instructions to form a first sampler circuit of the receiver circuit to receive the first signal and generate a first sample, the first sampler circuit controlled by a first clock signal having a first phase;

instructions to form a second sampler circuit of the receiver circuit to receive the second signal and generate a second sample, the second sampler circuit controlled by a second clock signal have a second phase;

instructions to form a timing generator to generate the first clock signal having the first phase and the second clock signal having the second phase, a phase offset between the first and second phases being a function of an approximation of a timing skew between the first and second signals.

17. The non-transitory information-bearing medium of claim 16 further comprising:

instructions to form a differential sampler circuit of the receiver circuit having an input communicatively coupled to an output of the first sampler circuit and an output of the second sampler circuit.

18. The non-transitory information bearing medium of claim 17 further comprising:

instructions to form a differential slicer circuit having input communicatively coupled to an output of the differential sampler circuit.

19. The non-transitory information-bearing medium of claim 18 further comprising:

instructions to form a skew detect circuit to detect a timing skew between the first and second signals received via the first and second signal paths.

20. A system for transferring data in the form of a differential signal comprising:

a differential signal transmitter;

a differential signal path communicatively coupled to the differential signal transmitter;

a differential signal receiver communicatively coupled to the differential signal path, the differential signal receiver comprising:

a first sampler operable to receive a first signal via the differential signal path and generate a first sample using a first clock signal having a first phase;

a second sampler operable to receive a second signal via the differential signal path and generate a second sample using a second clock signal having a second phase; and a comparator operable to produce a data bit based on the first and second samples, wherein the first and second phases are different, the difference between the first and second phases being a function of an approximation of a timing skew between the first signal and the second signal.

21. The system of claim 20 wherein the differential signal receiver further comprises a skew detector operable to determine a phase offset based on an evaluation of the quality of performance of the differential signal receiver and to generate the first and second clock signals having first and second phases, the difference between the first and second phases being based on the detected phase offset.

22. The system of claim 21 wherein the differential signal receiver and differential signal transmitter are elements of a communication path of a memory controller or memory.

23. An integrated circuit for resolving a differential signal received via a differential signal path, the differential signal including a first signal and a second signal:

a first sampler operable to receive the first signal via the differential signal path, the first sampler being controlled by a first clock signal;

a second sampler operable to receive the second signal via the differential signal path, the second sampler being controlled by a second clock signal;

a differential sampler having an input communicatively coupled to the outputs of the first sampler and the second sampler, the differential sampler being operable to resolve a received data value based on the outputs of the first sampler and the second sampler;

a timing generator operable to generate the first clock signal and the second clock signal, the first clock signal being offset in phase with respect to the second clock signal, the phase offset being a function of an approximation of a timing skew between the first signal and the second signal.

24. The integrated circuit of claim 23 further comprising a skew detector operable to detect the phase offset based on an evaluation of a quality of performance of the integrated circuit.

25. A memory comprising:

a plurality of data storage cells;

a differential receiver communicatively coupled to the data storage cells and operable to receive a differential signal including first and second signals, the first and second signals being representative of data values for storage in the plurality of storage cells;

wherein the differential receiver includes a first sampler operable to receiver the first signal via a differential signal path, the first sampler being controlled by a first clock signal, a second sampler operable to receive the second signal via the differential signal path, the second sampler being controlled by a second clock signal, and a differential sampler having an input communicatively coupled to the output of the first sampler and to the output of the second sampler, the differential sampler being operable to resolve a received data value from outputs of the first sampler and the second sampler, a timing generator operable to generate the first clock signal and the second clock signal, the first clock signal being offset in phase with respect to the second clock signal, the phase offset being a function of an approximation of a timing skew between the first signal and the second signal.

26. The memory of claim 25 further comprising a skew detector operable to detect the phase offset based on an evaluation of a quality of performance of the differential receiver.

27. The memory of claim 26 wherein the timing generator comprises at least one clock and data recovery circuit, at least one phase lock loop circuit and at least one phase mixer.

28. The memory of claim 27 wherein the plurality of data storage cells comprises data storage cells of a dynamic random access memory.

* * * * *